United States Patent [19]

Rupprecht et al.

[11] 4,076,558
[45] Feb. 28, 1978

[54] METHOD OF HIGH CURRENT ION IMPLANTATION AND CHARGE REDUCTION BY SIMULTANEOUS KERF IMPLANT

[75] Inventors: Hans Stephen Rupprecht, Yorktown Heights; Robert Otto Schwenker, Hopewell Junction, both of N.Y.

[73] Assignee: International Business Machines Corporation, Armonk, N.Y.

[21] Appl. No.: 763,789

[22] Filed: Jan. 31, 1977

[51] Int. Cl.$^2$ ................. H01L 21/265; H01L 21/461; H01L 21/425
[52] U.S. Cl. ..................................... 148/1.5; 357/91; 357/34; 250/310
[58] Field of Search ........................ 313/424; 357/91; 148/1.5

[56] References Cited

U.S. PATENT DOCUMENTS

| | | | |
|---|---|---|---|
| 3,701,696 | 10/1972 | Mets | 148/175 |
| 3,728,161 | 4/1973 | Moline | 148/1.5 |
| 3,772,576 | 11/1973 | Nienhuis et al. | 317/235 E |
| 3,790,412 | 2/1974 | Moline | 148/1.5 |

OTHER PUBLICATIONS

P. J. Krick, "MNOS — with Self-Aligned Ion–Implantation," IBM Tech. Disl. Bull. 17 (1974), 1809.
K. A. Pickar et al., Elec. Prop. of Si–Diode — B Ion Implantation, J. Appl. Phys. 19 (1971), 43.
S. Zirinsky, "Charge Transfer Prop. of MNOS — by Processing Parameters" J. Elect. Mat. 4, (1975), 591.

*Primary Examiner*—L. Dewayne Rutledge
*Assistant Examiner*—Roy Upendra
*Attorney, Agent, or Firm*—J. B. Kraft

[57] ABSTRACT

A method of ion implantation is provided which is particularly applicable to the fabrication of integrated circuits with high current ion implantation apparatus utilizing ion beams having currents of at least 0.5 ma. The method avoids excessive charge buildup on semiconductor wafer surfaces which may destroy the surface electrical insulation, thereby rendering the integrated circuit ineffective. The method involves forming in a layer of electrically insulative material over the wafer, a plurality of openings through the insulative layer in the various chip areas to expose the semiconductor wafer surfaces which are to be ion implanted with conductivity-determining impurities, and in addition, forming openings through the insulative layer over the kerf area between wafer chips to expose wafer kerf adjacent to the chip openings. The total area exposed in the wafer kerf must be greater than the total area exposed in said chip wafer openings. Then, a beam of ions having sufficient energy to implant ions in the exposed wafer in said chip area and kerf openings is directed at the wafer. The presence of the kerf openings avoids the problem of charge buildup. Then, the kerf area is removed by conventional dicing to separate the wafer into a plurality of chips.

10 Claims, 6 Drawing Figures

METHOD OF HIGH CURRENT ION IMPLANTATION AND CHARGE REDUCTION BY SIMULTANEOUS KERF IMPLANT

BACKGROUND OF INVENTION

Ion implantation is a technology of rapidly increasing importance in the fabrication of integrated circuits, particularly bipolar integrated circuits. In this bipolar technology, there is an increasing demand for (1) high dosage but relatively low time cycle implantation operations, and (2) ion implantation technology useful for introducing impurities through openings having at least one lateral dimension no greater than one mil. Since the implantation dosage is dependent on the combination of current and time, it follows that in order to achieve high dosage in relatively short time, the technology must move in the direction of high current ion implantation beams having currents greater than 0.5 ma. It has been found that when making such high current ion implantations of conductivity-determining impurities through electrically insulative layer openings having dimensions in the order of one mil as is required in the high density, large scale integrated circuits, there is a substantial tendency toward the impairment or destruction of portions of this electrically insulative layer resulting in potential short circuits which render the integrated circuit inoperative.

We believe that this impairment or destruction of the electrically insulative layer protecting the semiconductor integrated circuit is due to a charge buildup on this insulative layyer of the positive ions which make up the primary ion beam. This charge buildup is particularly pronounced in high current beams which have a high density of positive ions. In addition, when the openings through which the ions are to be implanted have small lateral dimensions in the order of one mil, secondary electrons which are normally produced by positive ions striking semiconductor substrate are minimized, and thus, there is an insufficient quantity of such secondary electrons available at the surface to neutralize the positive ion accumulation to prevent charge buildup.

SUMMARY OF THE PRESENT INVENTION

Accordingly, it is a primary object of the present invention to provide a method of ion implantation through the minute openings in insulative layers required in dense integrated circuits which is not subject to insulative layer breakdown.

It is another object of the present invention to provide a method of ion implantation utilizing high current beams which is not subject to breakdown of the insulative layer over the integrated circuit being implanted.

It is yet another object of the present invention to provide a method of ion implantation through relatively minute openings in the insulative layers of high density, large scale integrated circuits wherein positive charge accumulations which break down the insulative layer over the integrated circuit are prevented.

The above and other objects of the present invention are achieved by a method of ion implantation into wafers of semiconductor material having a plurality of spaced areas which are to be formed into a plurality of integrated circuit chips and a kerf area surrounding and separating the chip, in which method, a layer of electrically insulative material is formed over the wafer and a plurality of openings are formed through the insulative layer over the chip areas to expose the semiconductor wafer in such chip area openings. Openings are also formed through the insulative layer over the kerf area to expose the wafer kerf adjacent to such chip area openings; the total area exposed in the wafer kerf must be greater than the total area exposed in such chip area openings. A beam of ions is directed at the wafer and scanned across the wafer if necessary. This beam has sufficient energy to implant ions in the exposed wafer in both the chip area openings and the kerf openings. Subsequently, the kerf area is removed in the conventional manner to separate the wafer into a plurality of chips.

The method of the present invention is particularly effective when a high current ion beam, i.e., a beam having a current of at least 0.5 ma. is used in the implantation step. We have found that by opening a total area in the kerf insulative layer in excess of the total area of openings through which the implantation is made in the chip areas, breakdown of the electrically insulative layer over the wafers is greatly diminished, if not substantially eliminated.

The method of the present invention is particularly effective in preventing breakdowns due to charge accumulation when the chip apertures through which the implantation is made have lateral dimensions in the order of one mil or less, particularly wherein using high current beams.

The foregoing and other objects, features and advantages of the invention will be apparent from the following more particular description of the preferred embodiments of the invention, as illustrated in the accompanying drawings.

DESCRIPTION OF THE PREFERRED EMBODIMENT

Figure 1:
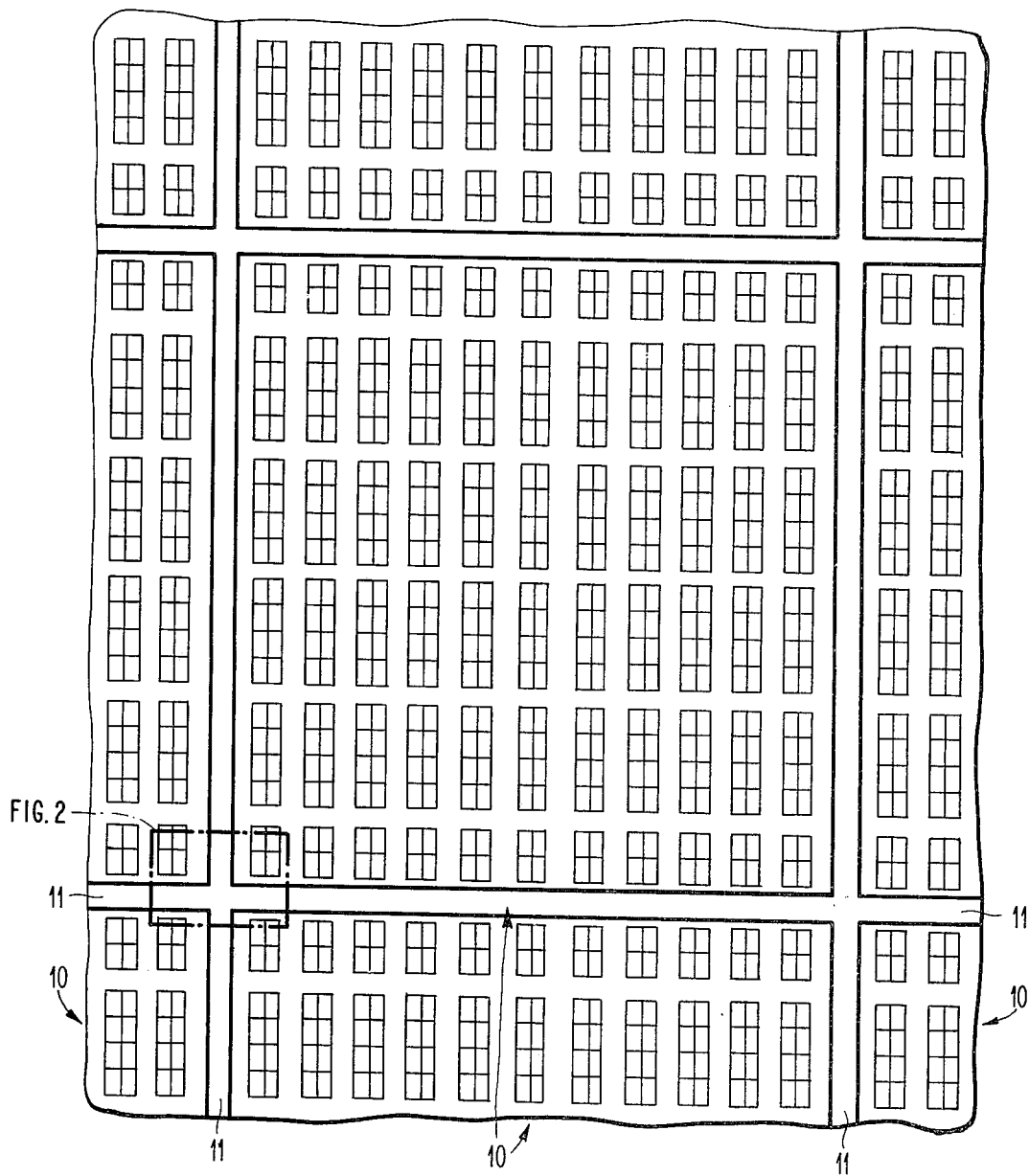
FIG. 1 is a diagrammatic plan view of a portion of a typical semiconductor wafer simplified in order to show the arrangement of the chips and the wafer kerf.

FIG. 1 shows a diagrammatic plan view of a layout of a portion of a conventional integrated circuit wafer. Chips 10 are separated by a kerf 11 which will be eliminated when the wafer is diced upon the completion of chip fabrication to break the wafer into a plurality of the chips 10. The section indicated in FIG. 1 is shown in greater detail in FIG. 2

Figure 2:
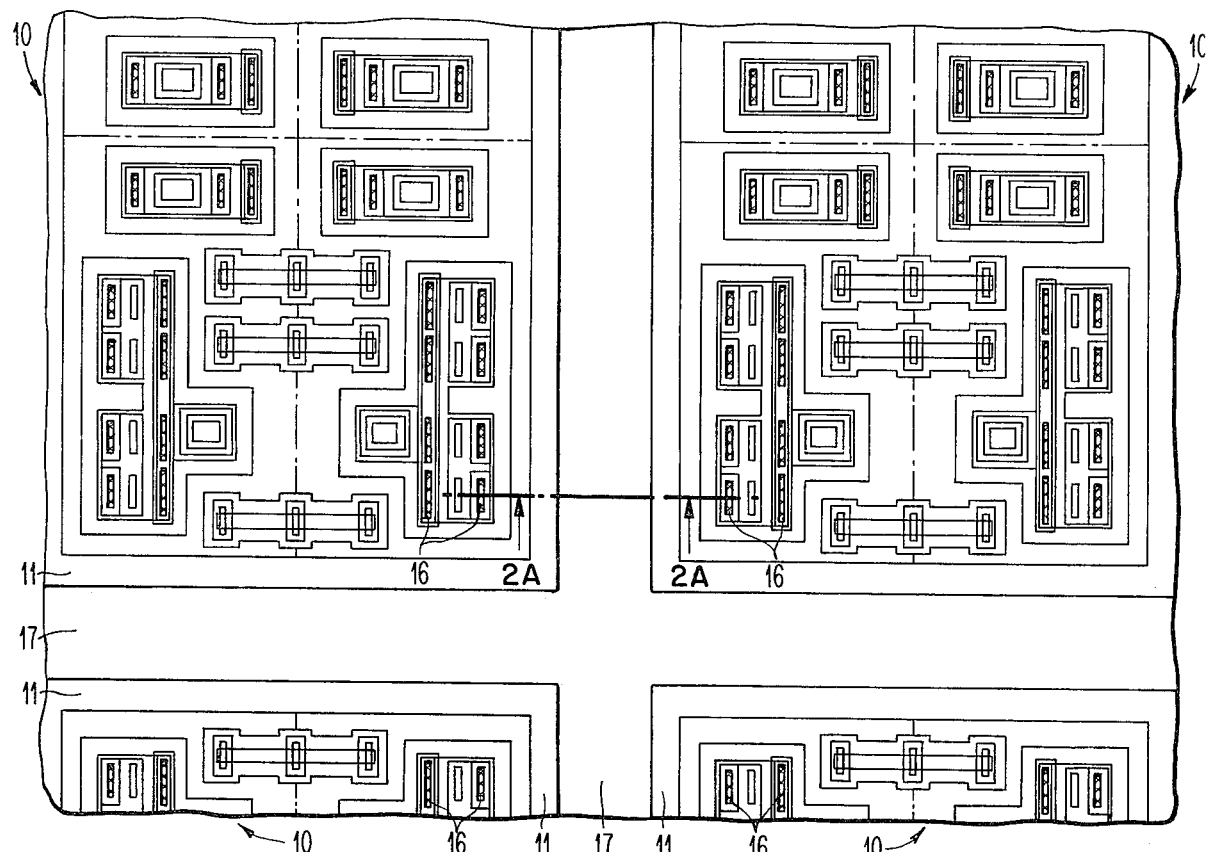
FIG. 2 is a more detailed diagrammatic plan view of a small portion of the wafer section indicated in FIG. 1.
Figure 2A:
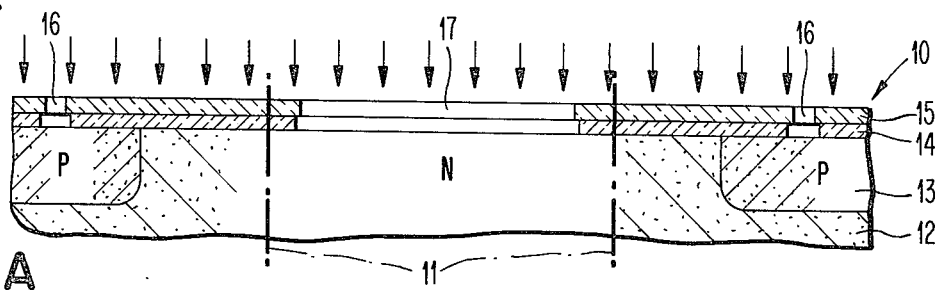
FIGS. 2A - 2C are diagrammatic enlarged cross-sectional views taken along the portion of the wafer of FIG. 2 designated by Lines 2A — 2A. For purposes of illustrating the present invention, FIGS. 2A - 2C have been simplified to show only portions and regions of the integrated circuits necessary to illustrate the operation of the present invention.

Referring first to FIG. 2 and the cross-sectional view of FIG. 2A, chips 10 are separated by a wafer kerf 11. The chips comprise N region 12 which may be formed by conventional epitaxial deposition on a semiconductor substrate not shown. P regions 13 which provide the base region for bipolar devices formed in the integrated circuit may also be formed by any conventional integrated circuit fabrication technique. The wafer is covered by a standard layer of electrically insulative material which is a composite of a lower layer 14 of silicon dioxide and an upper layer 15 of silicon nitride. In FIG. 2A, the kerf area of the wafer 11 which is to be subsequently removed is defined by phantom lines. For purposes of simplicity in illustration, many of the other regions which would normally be expected to be formed within an integrated circuit such as isolation regions between devices and circuits have not been shown. To this point in the process, the structure may be formed by any conventional integrated circuit fabrication technique well known in the art. Such techniques are described, for example, in U.S. Pat. No. 3,539,876.

Openings 16 through which N+ emitters are to be formed through the introduction of N-type conductivity-determining impurities by ion implantation are formed through insulative layers 14 and 15. The formation of the silicon dioxide 14-silicon nitride 15 composite insulative layers and openings therein is conventional in the art and is described in detail, for example, in U.S. Pat. No. 3,956,527. As previously set forth, large scale integrated circuits often demand very minute openings, e.g., having at least one lateral dimension of 0.1 mil or less. In the present example, let us assume that openings 16 which are shown crosshatched in FIG. 2 having a lateral demension of one mil in the narrow direction shown in the section in FIG. 2A and a lateral dimension of about 0.3 mils in the other direction.

With such minute openings, there is a tendency toward charge accumulation on insulative layer 14, 15 during ion implantation, especially with high current beams which may break down the insulative layer particularly in the regions of openings 16. The present invention solves this problem by forming openings 17 in the kerf region to expose epitaxial silicon layer 12 in the kerf openings 17, preferably formed simultaneously with openings 16 utilizing the methods referred to above. Openings 17 in kerf 11 are shown also crosshatched in FIG. 2. As may be observed, from FIG. 2, the total area of the openings 17 is greater than the total area of openings 16 to the chip. For best results with chip openings having the dimension set forth above, the total area of kerf openings 17 is at least five times the total area of chip area openings 16. Also, it is preferred that no chip area openings 16 be more than 400 mils from a kerf opening 17.

Also, we have noted that when the total area of the chip openings to be ion implanted is less than 3% and particularly less than 1% of the total area over which the ion implantation takes place, the tendency toward destructive charge buildup is very pronounced unless the kerf area is opened in accordance with the present invention. When the kerf is opened, then it is preferable that the total area, both chip openings plus kerf openings should exceed this 3%.

Figure 2B:
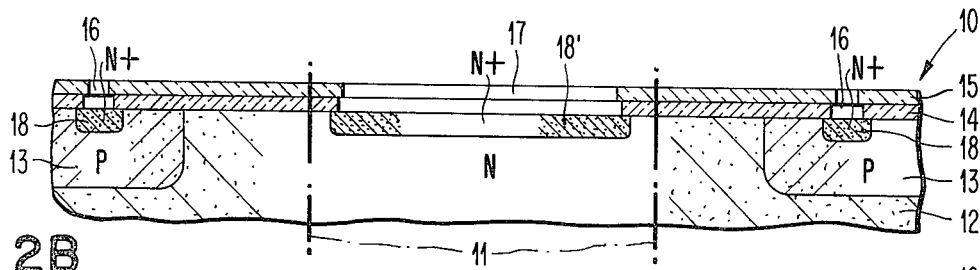
Figure 2C:
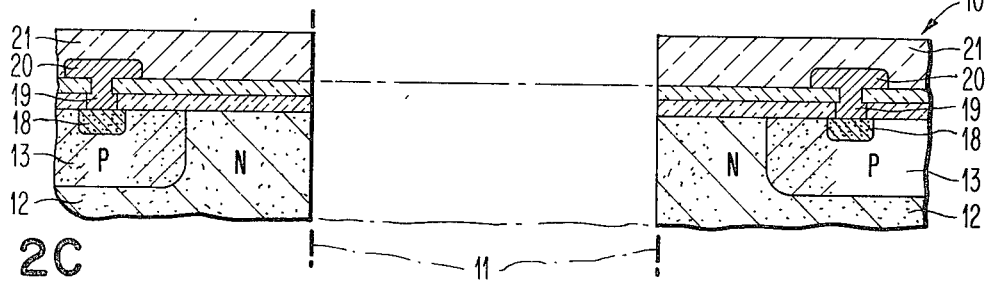

With the chip openings 16 and kerf openings 17 formed as shown, the surface of the wafer is then subjected to an ion implantation step wherein an ion beam is directed across the surface of the wafers as indicated by the arrows. To introduce arsenic ions, $^{75}As^+$, to form N+ emitter regions 18, FIG. 2B, as well as to incidentally form an N+ region 18' in the kerf. The introduction, i.e., ion implantation, is carried utilizing standard ion implantation equipment, for example, the equipment may be of the type described in U.S. Pat. No. 3,756,862. The bombardment is conducted at an energy of 40 Kev at room temperature, at an ion beam current of 0.5 to 3 ma. and a dosage of about $10^{16}$ ions/cm$^2$. Then, the ion implanted region is annealed at any conventional annealing temperature, after which all of the necessary subsequent steps to complete an integrated circuit chip when carried out in the conventional manner, e.g., the formation of metal emitter contacts 19, a metallization layer 20 and an insulative layer 21 among others, as shown in FIG. 2C. Upon the completion of the chip fabrication steps, the wafer is diced to eliminate kerf as shown in FIG. 2C.

While for purposes of the present invention, the opening in the kerf 17 has been shown to continuously extend through all kerf areas, it should be understood that such continuous and extensive kerf openings are not necessary. If it is desired to use portions of the kerf for test devices in the conventional manner, then of course the kerf openings 17 may be interrupted to accommodate such test devices. In such methods where the kerf openings 17 are not continuous, it is still preferred that the kerf openings be arranged so that no chip area opening is more than 400 mils from a kerf opening.

While the invention has been particularly shown and described with reference to the preferred embodiments thereof, it will be understood by those skilled in the art that various changes in form and details may be made therein without departing from the spirit and scope of the invention.

What is claimed is:

1. In the fabrication of integrated circuits, a method of ion implantation into wafers of semiconductor material having a plurality of spaced areas which are to be formed into a plurality of integrated circuit chips and a kerf area surrounding and separating said chips, said method comprising:
   forming a layer of electrically insulative material over said wafer,
   forming a plurality of openings through the insulative layer over said chip areas to expose the semiconductor wafer in said chip area openings,
   forming openings through the insulative layer over said kerf area to expose the wafer kerf adjacent to the chip area openings, the total area exposed in the wafer kerf being greater than the total area exposed in said chip area openings,
   directing a beam of ions at said wafer having sufficient energy to implant ions in the exposed wafer in said chip area and kerf openings, and
   removing the kerf area to separate the wafer into a plurality of chips.

2. The method of claim 1 wherein each of said chip area openings is within 400 mils from a kerf opening.

3. The method of claim 1 wherein said layer of electrically insulative material comprises a composite of a layer of silicon nitride on a layer of silicon dioxide.

4. The method of claim 2 wherein a plurality of said chip area openings have one maximum lateral dimension of 1 mil.

5. The method of claim 4 wherein said kerf openings have a total area of at least five times the total area of said chip area openings.

6. The method of claim 1 wherein said beam of ions is a high current beam having a current of at least 0.5 ma.

7. The method of claim 6 wherein each of said chip area openings is within 400 mils from a kerf opening.

8. The method of claim 6 wherein said layer of electrically insulative material comprises a composite of a layer of silicon nitride on a layer of silicon dioxide.

9. The method of claim 7 wherein a plurality of said chip area openings have one maximum lateral dimension of 1 mil.

10. The method of claim 9 wherein said kerf openings have a total area of at least five times the total area of said chip area openings.

* * * * *